US012687566B2

(12) United States Patent
He

(10) Patent No.: US 12,687,566 B2
(45) Date of Patent: Jul. 21, 2026

(54) DETECTOR AND METHOD FOR NON-INTRUSIVELY DETECTING ELECTROMAGNETIC INTERFERENCE

(71) Applicant: HONEYWELL INTERNATIONAL INC., Charlotte, NC (US)

(72) Inventor: Hongxi He, Shanghai (CN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 169 days.

(21) Appl. No.: 18/627,802

(22) Filed: Apr. 5, 2024

(65) Prior Publication Data

US 2025/0314685 A1    Oct. 9, 2025

(51) Int. Cl.
G01R 29/08 (2006.01)
G01R 15/18 (2006.01)

(52) U.S. Cl.
CPC ....... G01R 29/0892 (2013.01); G01R 15/181 (2013.01); G01R 29/0814 (2013.01)

(58) Field of Classification Search
CPC ............ G01R 29/0892; G01R 29/0814; G01R 15/181
See application file for complete search history.

(56) References Cited

U.S. PATENT DOCUMENTS

| | | | |
|---|---|---|---|
| 3,889,185 A | * | 6/1975 | Wojtasinski ......... G01R 15/181 |
| | | | 324/72 |
| 4,823,115 A | | 4/1989 | Mccallie |

| | | | |
|---|---|---|---|
| 5,657,197 A | | 8/1997 | Skinner, II et al. |
| 5,977,762 A | | 11/1999 | Murtha, Jr. et al. |
| 6,960,995 B2 | | 11/2005 | Parker et al. |
| 7,525,316 B2 | | 4/2009 | Kraz |

(Continued)

FOREIGN PATENT DOCUMENTS

| | | |
|---|---|---|
| CN | 109507528 A | 3/2019 |
| CN | 111983287 A | 11/2020 |

(Continued)

OTHER PUBLICATIONS

XP033606803_Joerres S et al: "Cloud-Based Monitoring for SPDs using Advanced Measuring Methods for Lightning Disturbance", 2019 11th Asia-Pacific International Conference on Lightning (APL), IEEE, Jun. 12, 2019 (Jun. 12, 2019), pp. 1-5, DOI: 10.1109/APL. 2019.8815985 ISBN: 978-1-7281-1694-5 [retrieved on Aug. 26, 2019].

(Continued)

*Primary Examiner* — Walter L Lindsay, Jr.
*Assistant Examiner* — Milton Gonzalez
(74) *Attorney, Agent, or Firm* — Ingrassia Fisher & Lorenz LLP

(57) ABSTRACT

A detector and method for detecting electromagnetic interference (EMI) events in a circuit include using a differential Rogowski coil and a processing circuit. The differential Rogowski coil is configured to sense current flow in at least a portion of the circuit and supply a coil output signal indicative of the sensed current flow. The processing circuit is coupled to receive the output signal from the differential Rogowski coil. The processing circuit is configured, from the output signal, to detect when an EMI event has occurred in the circuit and determine whether the EMI event is due to electrostatic discharge (ESD) or due to lightning.

14 Claims, 3 Drawing Sheets

(56)                    References Cited

U.S. PATENT DOCUMENTS

| | | | | |
|---|---|---|---|---|
| 7,714,743 | B1 * | 5/2010 | Woodell ................. | B64D 45/02 |
| | | | | 340/963 |
| 8,264,215 | B1 | 9/2012 | Kovac et al. | |
| 8,594,957 | B2 * | 11/2013 | Gauthier .............. | G01R 31/002 |
| | | | | 324/458 |
| 8,841,898 | B2 * | 9/2014 | Van Deventer ........ | B64D 45/02 |
| | | | | 324/72 |
| 2015/0260775 | A1 | 9/2015 | Yuen et al. | |
| 2023/0400502 | A1 | 12/2023 | Park et al. | |

FOREIGN PATENT DOCUMENTS

| | | |
|---|---|---|
| JP | 5391420 B2 | 1/2014 |
| JP | 2023030700 A | 3/2023 |

OTHER PUBLICATIONS

XP034437339_Lutzen H et al: "A Review of Current Sensors in Power Electronics: Fundamentals, Measurement Techniques and Components to Measure the Fast Transients of Wide Bandgap Devices", 2023 25th European Conference on Power Electronics and Applications (EPE'23 ECCE Europe), EPE Association, Sep. 4, 2023 (Sep. 4, 2023), pp. 1-11, DOI: 10.23919/EPE23ECCEEUROPE58414.2023.10264546 [retrieved on Oct. 3, 2023].

Fritz, Jan Niklas, et al, "PCB Integrated Differential Rogowski Coil for Non-Intrusive Current Measurement Featuring High Bandwidth and dv/dt Immunity", Institute for Power Electronics and Electrical Drives, Jan. 2015.

* cited by examiner

DETECTOR AND METHOD FOR NON-INTRUSIVELY DETECTING ELECTROMAGNETIC INTERFERENCE

TECHNICAL FIELD

The present disclosure generally relates to electromagnetic interference (EMI) detection, and more particularly to a detector and associated method for non-intrusively detecting EMI events.

BACKGROUND

As is generally known, electromagnetic interference (EMI) is unwanted noise or interference in an electrical path or electronic circuitry caused by an outside source. Depending on the severity, and EMI event can cause electronic circuitry to operate poorly, malfunction, or stop working completely.

There are various sources of EMI, both natural and human made. In some environments, such as various aerospace and other environments, two common EMI sources include lightning and electrostatic discharge (ESD). In many instances, it would be desirable to determine when an EMI event has occurred and, when it occurred, whether it was due to lightning or ESD. Presently, however, no known devices or methods exist to make this determination.

Hence, there is a need for a detector and associated method for non-intrusively detecting and classifying EMI events. The present disclosure addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a detector for detecting electromagnetic interference (EMI) events in a circuit includes a differential Rogowski coil and a processing circuit. The differential Rogowski coil is configured to sense current flow in at least a portion of the circuit and supply a coil output signal indicative of the sensed current flow. The processing circuit is coupled to receive the output signal from the differential Rogowski coil. The processing circuit is configured, from the output signal, to detect when an EMI event has occurred in the circuit and determine whether the EMI event is due to electrostatic discharge (ESD) or due to lightning.

In another embodiment, a detector for detecting electromagnetic interference (EMI) events in a circuit includes a differential Rogowski coil, an integrator circuit, a first comparator, a second comparator, a first time-to-digital converter, a second time-to-digital converter, and a processor. The differential Rogowski coil is configured to sense current flow in at least a portion of the circuit and supply a coil output signal indicative of the sensed current flow. The integrator circuit is coupled to receive the coil output signal from the differential Rogowski coil and is configured, upon receipt thereof, to integrate the coil output signal and supply an integrated coil output signal indicative of the sensed current flow, where the integrated coil output signal having an amplitude magnitude. The first comparator circuit is configured to detect when the amplitude magnitude of the integrated coil output signal exceeds a first threshold magnitude and supply a first output pulse having a first pulse duration indicative of a length of time that the integrated output signal exceeded the first threshold magnitude. The second comparator circuit is configured to detect when the amplitude magnitude of the integrated coil output signal exceeds a second threshold magnitude and supply a second output pulse having a second pulse duration indicative of a length of time that the integrated output signal exceeded the second threshold magnitude, where the second threshold magnitude is greater than the first threshold magnitude. The first time-to-digital converter is coupled to receive the first output pulse from the first comparator circuit and is configured to supply a first digital output signal representative of the first pulse duration. The second time-to-digital converter is coupled to receive the second output pulse from the second comparator circuit and is configured to supply a second digital output signal representative of the second pulse duration. The processor is in operable communication with at least the first comparator circuit, the second comparator circuit, the first time-to-digital converter, and the second time-to-digital converter. The processor is configured, upon receipt of at least one or more of the first output pulse, the second output pulse, the first digital output signal, and the second digital output signal, to determine whether the EMI event is due to electrostatic discharge (ESD) or due to lightning and supply digital data representative the determination. The EMI event is due to ESD at least when the amplitude magnitude of the integrated output signal exceeds the first threshold magnitude; and the EMI event is due to lightning at least when the amplitude magnitude of the integrated output signal exceeds the second threshold magnitude.

In yet another embodiment, a method for detecting electromagnetic interference (EMI) events in a circuit includes sensing current flow in at least a portion of the circuit using a differential Rogowski coil. A coil output signal is supplied from the differential Rogowski coil to a processing circuit that is indicative of the sensed current flow. Using the processing circuit, detecting when an EMI event has occurred in the circuit. Determining, using the processing circuit, whether the EMI event is due to electrostatic discharge (ESD) or due to lightning.

Furthermore, other desirable features and characteristics of the detector and method will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
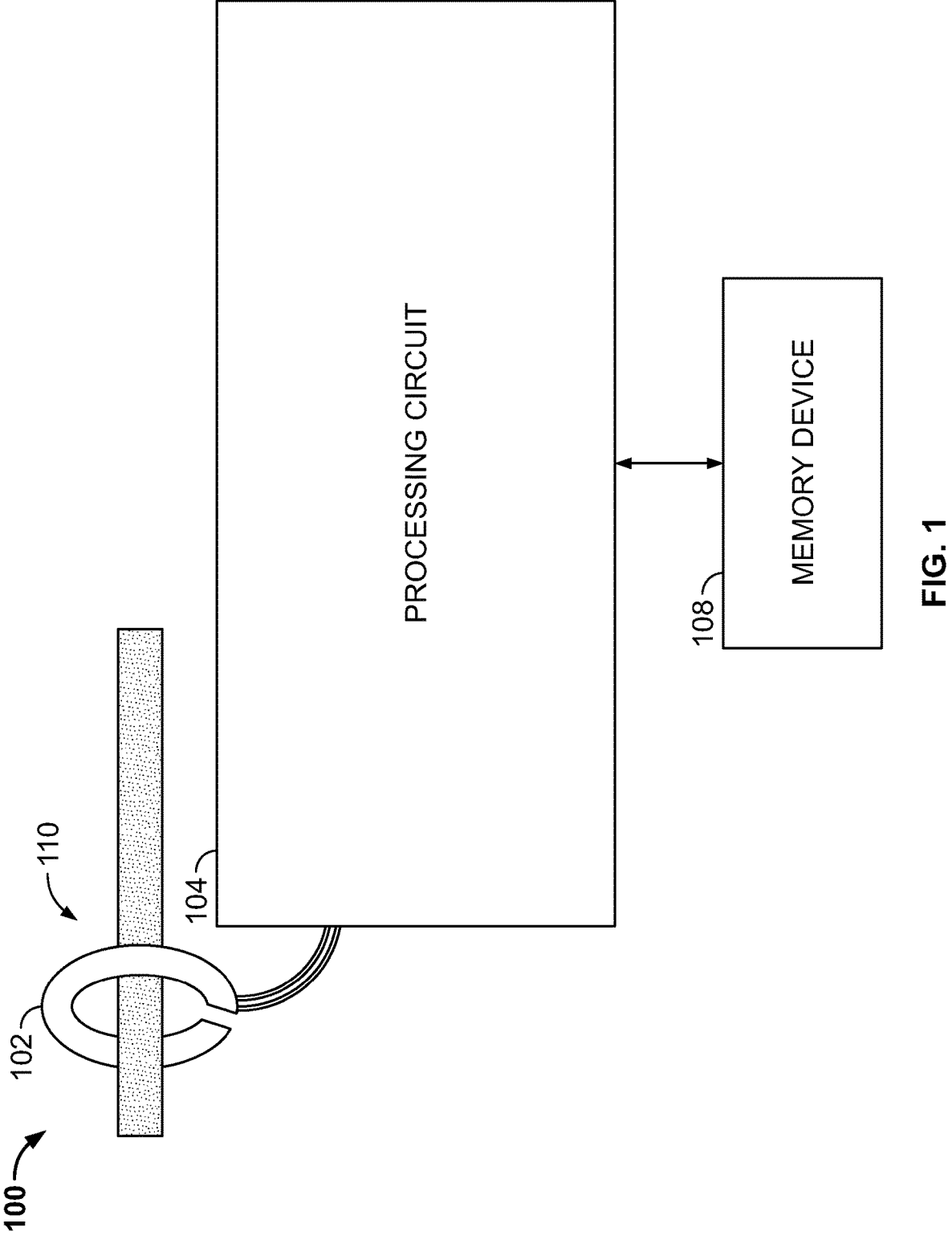
FIG. 1 depicts a functional block diagram of one embodiment of a detector for detecting electromagnetic interference (EMI) events in a circuit.

Referring to FIG. 1, a functional block diagram of an embodiment of a detector 100 for detecting electromagnetic interference (EMI) events in a circuit 110 is depicted. The depicted detector 100 includes a differential Rogowski coil 102 and a processing circuit 104. As is generally known, a differential Rogowski coil 102 comprises two inversely arranged wound coils with a neutral return conductor to correct interference that may be caused by capacitive coupling. The differential Rogowski coil, as is also generally known, measures alternating current (AC) or high-speed current pulses. In the depicted embodiment, the differential Rogowski coil 102 is configured to sense current flow in at least a portion of the circuit 100, and to supply a coil output signal indicative of the sensed current flow. It should be noted that for simplicity and ease of depiction and description, the circuit 110 is depicted as a single conductor element.

The processing circuit 104, a particular embodiment of which is described in more detail below, is coupled to receive the coil output signal from the differential Rogowski coil 102. The processing circuit 104 is configured, from the output signal, to detect when an EMI event has occurred in the circuit 110, and to also determine whether the EMI event is due to electrostatic discharge (ESD) or due to lightning. Although the processing circuit may be variously configured to implement this function, one embodiment is depicted in FIG. 2, and with reference thereto will now be described.

Figures 2, 3:
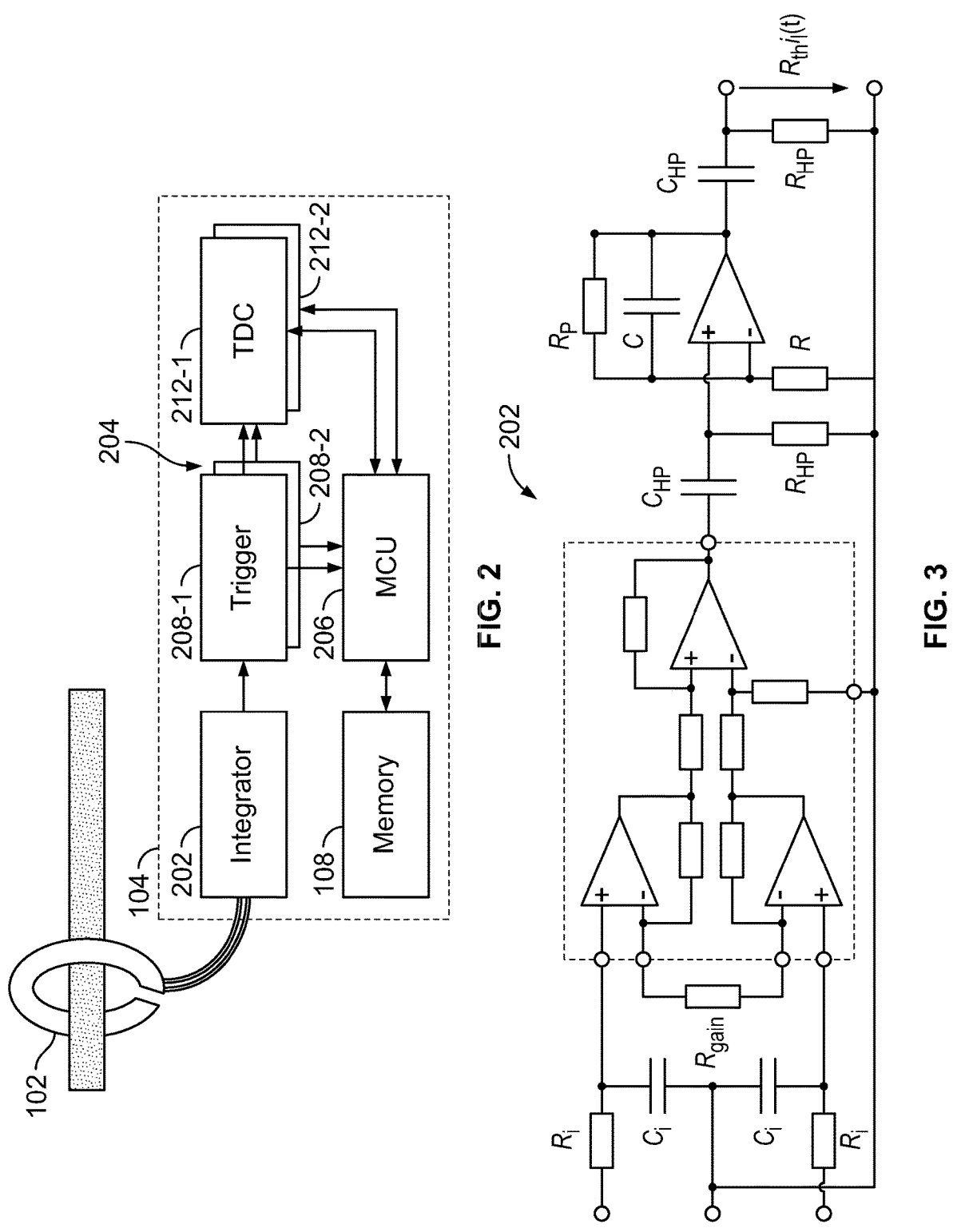
FIG. 2 depicts a functional block diagram of one embodiment of a processing circuit that may be used to implement the detector of FIG. 1.
FIG. 3 depicts a schematic representation of one example integrator circuit that may be used to implement the processing circuit of FIG. 2.

The processing circuit 104 depicted in FIG. 2 includes an integrator circuit 202, a trigger circuit 204, and a processor 206. The integrator circuit 202 is coupled to receive from the differential Rogowski coil 102 and is configured, upon receipt of the coil output signal, to integrate the coil output signal and to supply an integrated coil output signal having an amplitude magnitude and being indicative of the sensed current flow. It will be appreciated that the integrator circuit 202 may be implemented using any one of numerous known circuit topologies for performing an integrator function. One example circuit topology is depicted in FIG. 3, which includes a broadband differential to single-ended converter and a non-inverting integrator.

Returning to FIG. 2, no matter how the integrator circuit 202 is specifically implemented, the trigger circuit 204 is coupled to receive the integrated coil output signal from the integrator circuit 202 and is configured, upon receipt of the integrated coil output signal, to detect at least when the amplitude magnitude of the integrated coil output signal exceeds a first threshold magnitude, and at least when the amplitude magnitude of the integrated coil output signal exceeds a second threshold magnitude, which is greater than the first threshold magnitude. The values of the first and second threshold magnitudes may vary. However, the difference between the two threshold magnitudes is selected to be able to discriminate between an EMI event that is due to ESD and that is due to lightning.

It will be appreciated that the trigger circuit 204 may also be implemented using any one of numerous known circuit topologies for performing its function. In the depicted embodiment, however, it includes two comparator circuits-a first comparator circuit 208-1 and a second comparator circuit 208-1. It will be appreciated that the first and second comparator circuits 208-1, 208-2 may be implemented using any one of numerous known high-speed comparator circuit topologies. It will additionally be appreciated that the trigger circuit 204 could be implemented with more than two comparator circuits 208, if needed or desired.

Regardless of how the first and second comparator circuits 208-1, 208-2 are specifically implemented, the first comparator circuit 208-1 is configured to detect when the amplitude magnitude of the integrated coil output signal exceeds the first threshold magnitude. The first comparator circuit 208-1 is additionally configured, upon detecting that the amplitude magnitude of the integrated coil output signal exceeds the first threshold magnitude, to supply a first output pulse having a first pulse duration that is indicative of the length of time that the integrated coil output signal exceeded the first threshold magnitude.

The second comparator circuit 208-2 is configured to detect when the amplitude magnitude of the integrated coil output signal exceeds the second threshold magnitude. The second comparator circuit 208-2 is additionally configured, upon detecting that the amplitude magnitude of the integrated coil output signal exceeds the second threshold magnitude, to supply a second output pulse having a second pulse duration that is indicative of the length of time that the integrated coil output signal exceeded the second threshold magnitude.

As will be described in more detail below, the processing circuit 104 is configured to determine whether a detected EMI event is due to ESD or lightning based on whether the integrated coil output signal exceeds the first or second threshold magnitude. More specifically, the processing circuit 104 determines that the EMI event is due to ESD at least when the amplitude magnitude of the integrated coil output signal exceeds the first threshold magnitude, and that the EMI event is due to lightning at least when the amplitude magnitude of the integrated coil output signal exceeds the second threshold magnitude.

To facilitate the above-described functionality, the depicted processing circuit 104 additionally includes two time-to-digital converters 212-a first time-to-digital converter 212-1 and a second time-to-digital converter 212-2. The first time-to-digital converter 212-1 is coupled to receive the first output pulse from the first comparator circuit 208-1 and is configured to supply a first digital output signal representative of the first pulse duration. The second time-to-digital converter 212-2 is coupled to receive the second output pulse from the second comparator circuit 208-2 and is configured to supply a second digital output signal representative of the second pulse duration. It will be appreciated that the time-to-digital converters 212-1, 212-2 may be implemented using any one of numerous known time-to-digital converters. In one embodiment, each is implemented using a TDC7200 manufactured by Texas Instruments Inc. It will additionally be appreciated that the processing circuit 104 could be implemented with more than two time-to-digital converters 212, if needed or desired. Preferably, however, the number of time-to-digital converters 212 will match the number of comparator circuits 208.

The processor 206 is in operable communication with at least the first comparator circuit 208-1, the second comparator circuit 208-2, the first time-to-digital converter 212-1, and the second time-to-digital converter 212-2. The processor 206 is configured, upon receipt of at least one or more of the first output pulse, the second output pulse, the first digital output signal, and the second digital output signal, to determine whether the EMI event is due to ESD or is due to lightning and to supply digital data representative the determination. It will be appreciated that the processor 206 may be implemented using any one of numerous general-purpose processors or microcontroller units (MCUs). Preferably, the selected processor 206 will include at least SPI (serial peripheral interface) buses, a real-time clock, and operability at least at 10 MHz.

Before proceeding further, it is noted that the detector 100, as FIGS. 1 and 2 depict, may additionally include a static memory device 108. The static memory device 108, which may be implemented using any one of numerous types of non-volatile memory devices, is in operable communication with the processing circuit 104, and more specifically with the processor 206, and is coupled to receive and store the digital data supplied by the processor 206. The digital data, as noted above, is representative of the determination as to whether a detected EMI event was due to ESD or to lightning. Thus, personnel may be able to retrieve the data from memory at a later time to determine which, and how many, of each EMI event the circuit 110 experienced.

Figure 4:
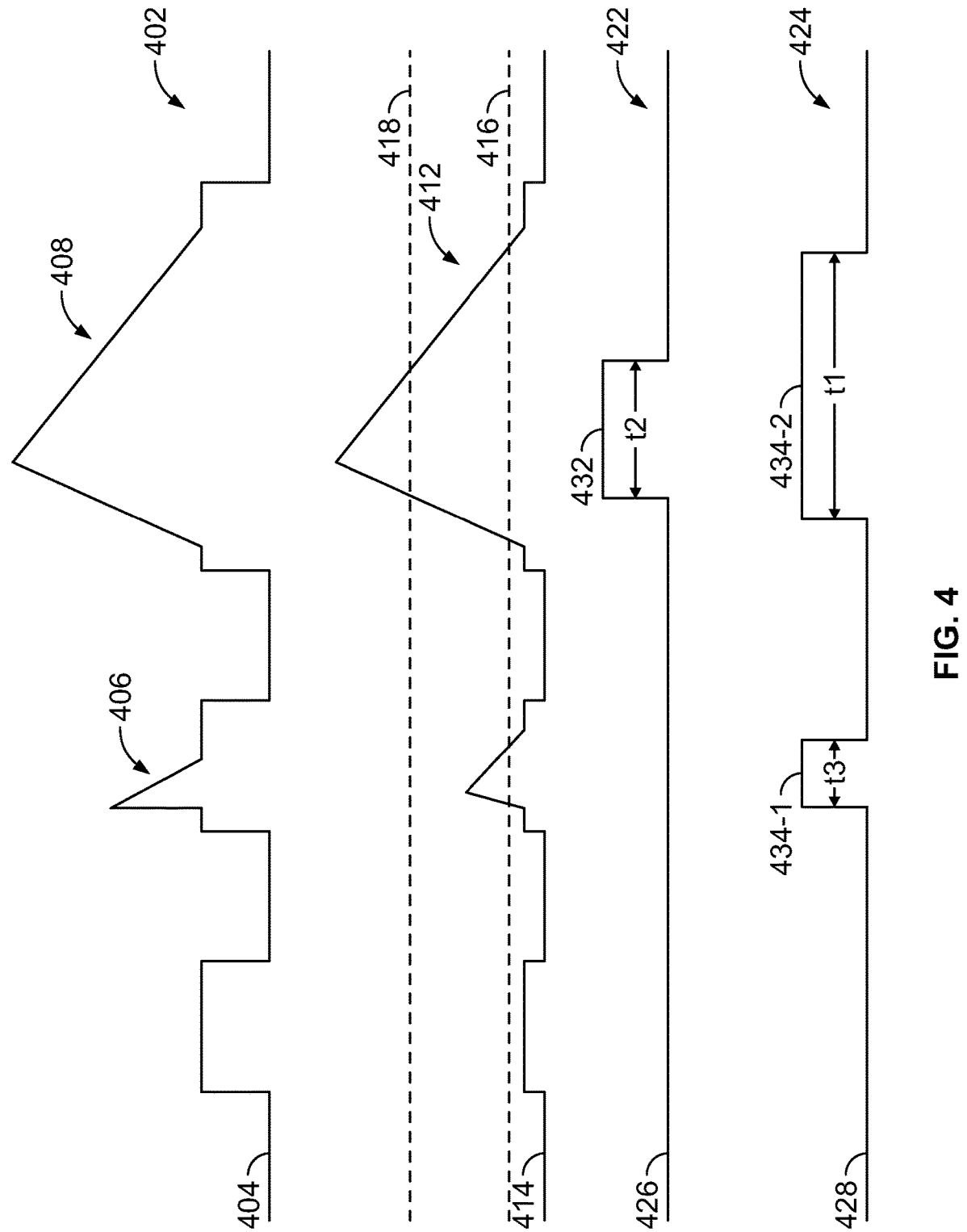
FIG. 4 depicts various waveforms associated with the detector of FIG. 1 in response to different EMI events.

Having described the detector 100, its configuration general functionality. A more detailed description of the its operation, in response to both an ESD event and a lightning event, will now be described. In doing so, reference should be made to FIG. 4, which depicts various waveforms output by the differential Rogowski coil 102 and various waveforms within the processing circuit 104.

More specifically, waveform 402 is an example the coil output signal 404, supplied by the differential Rogowski coil 102, that is indicative of the current flow sensed in the circuit 110. The depicted coil output signal 404 includes examples that may result when the circuit 110 experiences a typical ESD event 406 and a typical lightning event 408. As depicted, the typical ESD event 406 is of a lower amplitude and a shorter duration as compared to the typical lightning event 408.

Waveform 412 depicts the integrated coil output signal 414. As depicted, the amplitude of the ESD event in the integrated coil output signal 414 is lower, and the associated duration is slightly longer than in the coil output signal 404. This is because some high-frequency components of the coil output signal 404 are removed. However, the amplitude and duration of the lightning event are substantially the same. This is because most of the frequencies associated with a lightning event are typically below 1 MHz.

As noted above, the integrated coil output signal 414 is supplied to the trigger circuit 204, which detects when the amplitude magnitude of the integrated coil output signal 414 exceeds the first and second threshold magnitudes. The first threshold magnitude 416 and the second threshold magnitude 418 are also depicted along with the integrated coil output signal 414, to depict when the amplitude magnitude of the integrated coil output signal 414 exceeds each threshold magnitude 416, 418.

Waveform 422 depicts the output signal 426 of the second comparator circuit 208-2, and waveform 424 depicts the output signal 428 of the first comparator circuit 208-1. As shown, the output signal 426 of second comparator circuit 208-2 includes an output pulse 432 that has a pulse duration $(t_2)$ indicative of the length of time that the integrated coil output signal 414 exceeded the second threshold magnitude 418. As described above, the output of the second comparator 208-2, which includes the output pulse 432, is supplied to the second time-to-digital converter 212-2, which in turn supplies a digital output signal representative of the pulse duration $(t_2)$ to the processor 206.

The output signal 428 of first comparator circuit 208-1 includes output two output pulses 434—a first output pulse 434-1 and a second output pulse 434-2. The first output pulse 434-1 has a first pulse duration $(t_1)$ and the second pulse 434-2 has a second pulse duration $(t_3)$. Both pulse durations $(t_1, t_3)$ are indicative of the length of time that the integrated coil output signal 414 exceeded the first threshold magnitude 416. As may be appreciated, the second pulse duration $(t_3)$ is longer than the first pulse duration $(t_1)$, because the second pulse 434-2 is the result of the lightning event 408. As was also described above, the output of the first comparator 208-1, which includes the first and second output pulses 432, 434, is supplied to the first time-to-digital converter 212-1, which in turn supplies digital output signals representative of the pulse durations $(t_1, t_3)$ to the processor 206.

The processor 206, as was also noted above, upon receipt of output pulses 432, 434 from the comparators 208-1, 208-2 and the digital output signals from the time-to-digital converters 212-1, 212-2, determines when an EMI event is due to ESD and when it is due to lightning and generates and supplies digital data representative the determination. The digital data, which is generated after each pulse that is output from the first comparator 208-1, is supplied to the static memory device 108.

The detector described herein non-intrusively detects and classifies EMI events and stores data, for later retrieval, of each detected EMI event.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A detector for detecting electromagnetic interference (EMI) events in a circuit, comprising:
a differential Rogowski coil configured to sense current flow in at least a portion of the circuit and supply a coil output signal indicative of the sensed current flow; and
a processing circuit coupled to receive the output signal from the differential Rogowski coil, the processing circuit configured, from the output signal, to (i) detect when an EMI event has occurred in the circuit and (ii) determine whether the EMI event is due to electrostatic discharge (ESD) or due to lightning,
wherein the processing circuit comprises:
an integrator circuit coupled to receive the coil output signal from the differential Rogowski coil and configured, upon receipt thereof, to integrate the coil output signal and supply an integrated coil output signal indicative of the sensed current flow, the integrated coil output signal having an amplitude magnitude; and
a trigger circuit coupled to receive the integrated coil output signal from the integrator circuit and configured, upon receipt thereof, to detect at least (i) when the amplitude magnitude of the integrated coil output signal exceeds a first threshold magnitude and (ii) when the amplitude magnitude of the integrated coil output signal exceeds a second threshold magnitude, the second threshold magnitude being greater than the first threshold magnitude.

2. The detector of claim 1, wherein the processing circuit is configured to:
determine that the EMI event is due to ESD at least when the amplitude magnitude of the integrated coil output signal exceeds the first threshold magnitude; and
determine that the EMI event is due to lightning at least when the amplitude magnitude of the integrated coil output signal exceeds the second threshold magnitude.

3. The detector of claim 1, wherein the trigger circuit comprises at least:
a first comparator circuit configured to (i) detect when the amplitude magnitude of the integrated coil output signal exceeds the first threshold magnitude and (ii) supply a first output pulse having a first pulse duration indicative of a length of time that the integrated coil output signal exceeded the first threshold magnitude; and a second comparator circuit configured to (i) detect when the amplitude magnitude of the integrated coil output signal exceeds the second threshold magnitude and (ii) supply a second output pulse having a second pulse duration indicative of a length of time that the integrated coil output signal exceeded the second threshold magnitude.

4. The detector of claim 3, wherein the processing circuit further comprises at least:

a first time-to-digital converter coupled to receive the first output pulse from the first comparator circuit and configured to supply a first digital output signal representative of the first pulse duration; and a second time-to-digital converter coupled to receive the second output pulse from the second comparator circuit and configured to supply a second digital output signal representative of the second pulse duration.

5. The detector of claim 4, wherein the processing circuit further comprises:

a processor in operable communication with at least the first comparator circuit, the second comparator circuit, the first time-to-digital converter, and the second time-to-digital converter, the processor configured, upon receipt of at least one or more of the first output pulse, the second output pulse, the first digital output signal, and the second digital output signal, to determine whether the EMI event is due to electrostatic discharge (ESD) or due to lightning and supply digital data representative the determination.

6. The detector of claim 5, further comprising:

a static memory device in operable communication with the processor and coupled to receive and store the digital data supplied by the processor.

7. A detector for detecting electromagnetic interference (EMI) events in a circuit, comprising:

a differential Rogowski coil configured to sense current flow in at least a portion of the circuit and supply a coil output signal indicative of the sensed current flow;

an integrator circuit coupled to receive the coil output signal from the differential Rogowski coil and configured, upon receipt thereof, to integrate the coil output signal and supply an integrated coil output signal indicative of the sensed current flow, the integrated coil output signal having an amplitude magnitude;

a first comparator circuit configured to (i) detect when the amplitude magnitude of the integrated coil output signal exceeds a first threshold magnitude and (ii) supply a first output pulse having a first pulse duration indicative of a length of time that the integrated output signal exceeded the first threshold magnitude;

a second comparator circuit configured to (i) detect when the amplitude magnitude of the integrated coil output signal exceeds a second threshold magnitude and (ii) supply a second output pulse having a second pulse duration indicative of a length of time that the integrated output signal exceeded the second threshold magnitude, the second threshold magnitude being greater than the first threshold magnitude;

a first time-to-digital converter coupled to receive the first output pulse from the first comparator circuit and configured to supply a first digital output signal representative of the first pulse duration;

a second time-to-digital converter coupled to receive the second output pulse from the second comparator circuit and configured to supply a second digital output signal representative of the second pulse duration; and a processor in operable communication with at least the first comparator circuit, the second comparator circuit, the first time-to-digital converter, and the second time-to-digital converter, the processor configured, upon receipt of at least one or more of the first output pulse, the second output pulse, the first digital output signal, and the second digital output signal, to determine whether the EMI event is due to electrostatic discharge (ESD) or due to lightning and supply digital data representative the determination, wherein:

the EMI event is due to ESD at least when the amplitude magnitude of the integrated output signal exceeds the first threshold magnitude; and the EMI event is due to lightning at least when the amplitude magnitude of the integrated output signal exceeds the second threshold magnitude.

8. The detector of claim 7, further comprising:

a static memory device in operable communication with the processor and coupled to receive and store the digital data supplied by the processor.

9. A method for detecting electromagnetic interference (EMI) events in a circuit, the method comprising the steps of:

sensing current flow in at least a portion of the circuit using a differential Rogowski coil;

supplying a coil output signal, from the differential Rogowski coil to a processing circuit, that is indicative of the sensed current flow; and detecting, using the processing circuit, when an EMI event has occurred in the circuit;

determining, using the processing circuit, whether the EMI event is due to electrostatic discharge (ESD) or due to lightning;

integrating the coil output signal, using an integrator circuit coupled to receive the coil output signal from the differential Rogowski coil and configured, upon receipt thereof, to and supply an integrated coil output signal indicative of the sensed current flow, the integrated coil output signal having an amplitude magnitude; and detecting, using a trigger circuit, at least (i) when the amplitude magnitude of the integrated coil output signal exceeds a first threshold magnitude and (ii) when the amplitude magnitude of the integrated output signal exceeds a second threshold magnitude, the second threshold magnitude being greater than the first threshold magnitude.

10. The method of claim 9, wherein:

the EMI event is due to ESD at least when the amplitude magnitude of the integrated output signal exceeds the first threshold magnitude; and the EMI event is due to lightning at least when the amplitude magnitude of the integrated output signal exceeds the second threshold magnitude.

11. The method of claim 9, wherein the trigger circuit comprises at least a first comparator circuit and a second comparator circuit, and the method further comprises:

detecting, using the first comparator circuit, when the amplitude magnitude of the integrated coil output signal exceeds the first threshold magnitude;

supplying, from the first comparator circuit, a first output pulse having a first pulse duration indicative of a length of time that the integrated coil output signal exceeded the first threshold magnitude;

detecting, using the second comparator circuit, when the amplitude magnitude of the integrated coil output signal exceeds the second threshold magnitude; and supplying, from the second comparator circuit, a second output pulse having a second pulse duration indicative of a length of time that the integrated coil output signal exceeded the second threshold magnitude.

12. The method of claim 11, further comprising:

receiving, in a first time-to-digital converter, the first output pulse from the first comparator circuit;

supplying a first digital output signal, from the first time-to-digital converter, representative of the first pulse duration;

receiving, in a second time-to-digital converter, the second output pulse from the second comparator circuit; and supplying a second digital output signal, from the second time-to-digital converter, representative of the second pulse duration.

13. The method of claim 12, further comprising:

supplying, to a processor, at least one or more of the first output pulse, the second output pulse, the first digital output signal, and the second digital output signal; and determining, using the processor, whether the EMI event is due to electrostatic discharge (ESD) or due to lightning; and supplying, from the processor, digital data representative of the determination.

14. The method of claim 13, further comprising:

receiving and storing, in a static memory device, the digital data supplied by the processor.

\* \* \* \* \*